(12) United States Patent
Chang et al.

(10) Patent No.: US 8,339,785 B2
(45) Date of Patent: Dec. 25, 2012

(54) WATER-COOLING TYPE COOLER AND INVERTER HAVING THE SAME

(75) Inventors: Seok Chae Chang, Seoul (KR); Su Dong Lee, Gyeonggi-Do (KR)

(73) Assignee: LS Industrial Systems Co., Ltd., Anyang Gyeonggi-Do (KR)

(*) Notice: Subject to any disclaimer, the term of this patent is extended or adjusted under 35 U.S.C. 154(b) by 271 days.

(21) Appl. No.: 12/801,006

(22) Filed: May 17, 2010

(65) Prior Publication Data

US 2010/0296247 A1   Nov. 25, 2010

(30) Foreign Application Priority Data

May 22, 2009   (KR) .................. 10-2009-0045139

(51) Int. Cl.
  *H05K 7/20*   (2006.01)
  *F28F 7/00*   (2006.01)
(52) U.S. Cl. ...................... 361/699; 165/80.4
(58) Field of Classification Search .......... 165/80.4; 361/699
See application file for complete search history.

(56) References Cited

U.S. PATENT DOCUMENTS

| | | | | |
|---|---|---|---|---|
| 3,327,776 | A * | 6/1967 | Butt ............................ | 165/80.4 |
| 4,884,168 | A * | 11/1989 | August et al. ................ | 361/702 |
| 7,417,857 | B2 * | 8/2008 | Rondier et al. ............... | 361/699 |
| 7,876,563 | B2 * | 1/2011 | Shiba ........................... | 361/699 |
| 2002/0011327 | A1 | 1/2002 | Fukazu et al. | |
| 2004/0150271 | A1 | 8/2004 | Koga et al. | |
| 2007/0163765 | A1 | 7/2007 | Rondier et al. | |
| 2010/0315780 | A1 * | 12/2010 | Murakami .................... | 361/699 |

FOREIGN PATENT DOCUMENTS

| | | |
|---|---|---|
| CN | 1860607 | 11/2006 |
| CN | 101379611 | 3/2009 |
| EP | 1 981 081 A1 | 10/2008 |
| JP | 2002-46482 | 2/2002 |
| JP | 2003-199292 | 7/2003 |
| JP | 2003-199294 | 7/2003 |
| JP | 2003-234589 | 8/2003 |
| JP | 2007-207917 | 8/2007 |
| JP | 2010-27963 | 2/2010 |
| WO | 2009/098949 A1 | 8/2009 |
| WO | 2009/100798 A1 | 8/2009 |

OTHER PUBLICATIONS

Japan Office action, mail date is Aug. 9, 2011.

* cited by examiner

*Primary Examiner* — Gregory Thompson
(74) *Attorney, Agent, or Firm* — Lee, Hong, Degerman, Kang & Waimey (57) ABSTRACT

A water-cooling type cooler and an inverter employing the same are disclosed. A guide pin for distributing cooling water is formed in the middle of a cooling water flow path having a bent face, to make a flow rate of cooling water at the bent portion of the cooling water flow path uniform to thus improve cooling performance of the water-cooling type cooler. In addition, because the cooling performance of the water-cooling type cooler is improved without extending the cooling pin, an increase in the weight of the water-cooling type cooler can be reduced and a fabrication cost of the water-cooling type cooler can be reduced.

11 Claims, 6 Drawing Sheets

WATER-COOLING TYPE COOLER AND INVERTER HAVING THE SAME

Pursuant to 35 U.S.C. §119(a), this application claims the benefit of earlier filing date and right of priority to Korean Patent Application No. 10-2009-045139, filed on May 22, 2009, the contents of which are hereby incorporated by reference herein in its entirety.

BACKGROUND OF THE INVENTION

1. Field of the Invention

The present invention relates to a water-cooling type cooler and, more particularly, to a water-cooling type cooler having a simple cooling water flow path to maximize a cooling performance of a water-cooling type inverter used for an electric vehicle or the like as well as to enhance a cooling effect.

2. Description of the Related Art

In general, an internal combustion engine such as a petroleum engine commonly used as a vehicle engine uses thermal energy generated by burning fuel within a cylinder, as power. Exhaust discharged after combustion from the internal combustion engine contains harmful components such as nitrogen oxide due to the combustion and carbon monoxide and hydrocarbon due to imperfect combustion, contaminating air. Thus, over the environmental pollution problem and the exhaustion of fossil fuel, research on vehicle engine using alternative energy such as solar heat or electricity is actively ongoing in many countries.

Among vehicle engines using alternative energy, an electric vehicle engine, which drives vehicle by using electrical energy has the highest feasibility of commercialization. The electric vehicle engine has a structure in which a motor is rotated by electricity supplied from a storage battery, instead of gasoline of a petroleum engine, generated rotary power of the motor is decelerated by a decelerator, and the decelerated rotary power is transferred to left and right driving wheels through a differential gear, thus allowing for running of a vehicle.

The electric vehicle is based on a principle that a driving motor constituting a driving system is driven by electricity supplied from the storage battery corresponding to an energy source to transfer power to the wheels. The driving system including the driving motor and an inverter that controls the driving motor generates high temperature heat during the driving process due to its structural characteristics and operational characteristics, so a cooling system is operated in order to remove the high temperature heat. Namely, the system for cooling the driving system is circulated in the order of radiator→cooling pump→inverter→driving motor→and radiator.

The driving motor constituting the driving system is designed to have such durability as to tolerate heat to a degree, but the inverter including numerous electronic chips is very sensitive. Thus, when the inverter is not properly cooled, heat makes a bad influence to the operation or controlling of the inverter and melts the soldering that bonds elements to cause a connection deficiency of circuits. Also, a circuit board installed within a main body of the inverter generally includes a power module, a control board, a power board, and a driving board. In particular, heat is mostly generated from the power module including a plurality of power switching elements.

Thus, the related art water-cooling type cooler is known to be configured such that a cooling water flow path is formed on a bottom surface of a cooler constituting the main body of the inverter and having a power module coupled on its upper surface and cooling water is allowed to flow to the cooling water flow path to cool the power module. The cooling water flow path of the water-cooling type cooler is formed to have a zigzag shape to allow cooling water to extensively be brought into contact with the cooling water flow path for a longer period of time. The shape of the cooling water flow path may differ depending on the position of the power module installed within the inverter, or may differ depending on the number or positions of power switching elements constituting the power module. Cooling pins are formed at the cooling water flow path in order to increase the contact area with cooling water. The cooling pins are configured such that their pitch is narrower at an area from which a larger amount of heat is generated and their pitch is wider at an area from which a smaller amount of heat is generated, according to the amount of generated heat of the power module.

Figure 1:
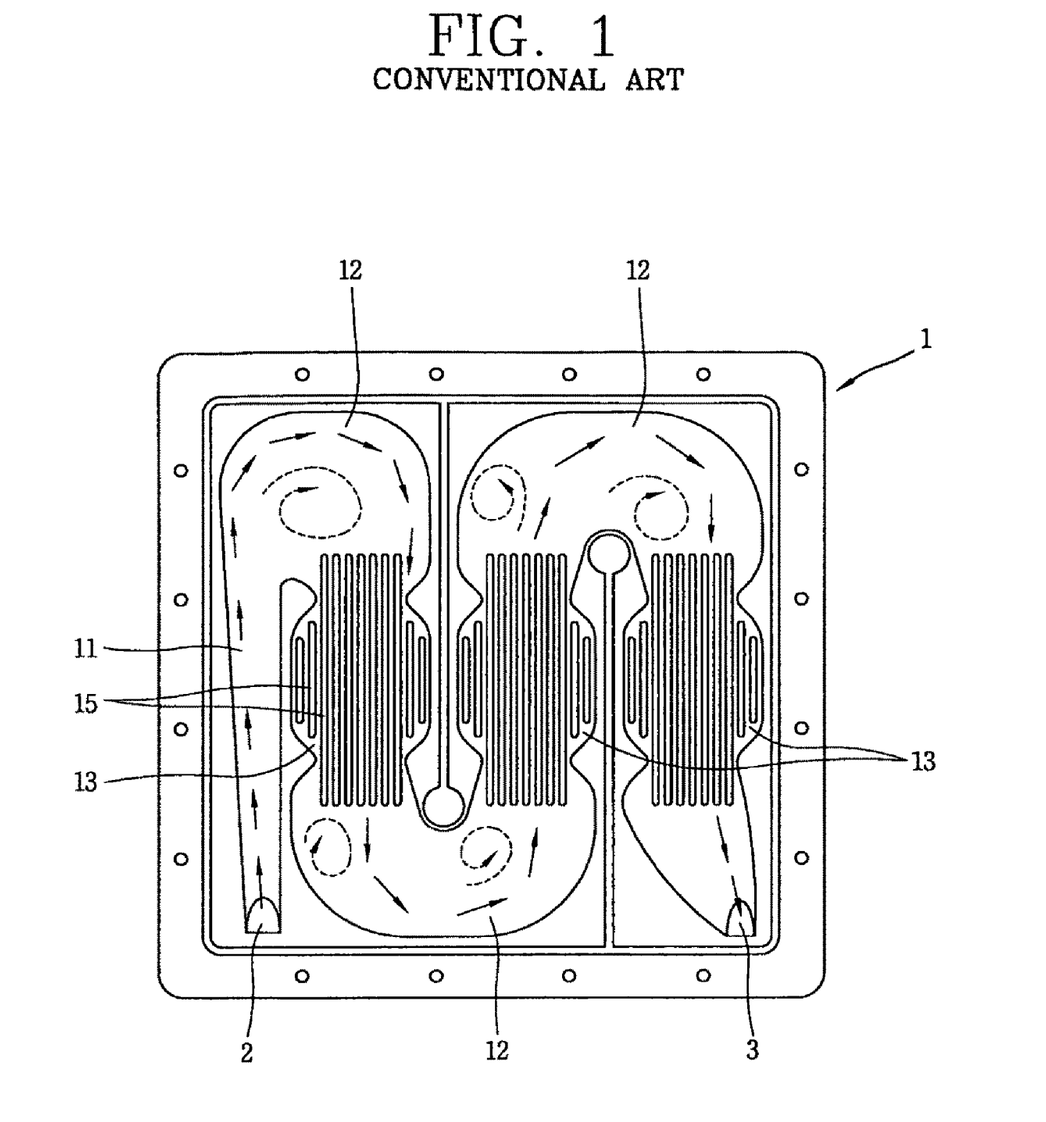
FIG. 1 is a plan view showing a cooling water flow path in the related art water-cooling type cooler.

FIG. 1 is a plan view of a cooling water flow path of the related art water-cooling type cooler.

As illustrated, the cooling water flow path of the related art water-cooling type cooler 1 includes a first flow path part 11 forming a single linear flow path, a second flow path part 12 connected to the first flow path part 11 and forming a single curved flow path, and a third flow path part 13 connected to the second flow path part 12, forming a linear flow path, and forming a plurality of channels by means of a plurality of cooling pins 15.

A single first flow path part 11 is formed, while a plurality of second and third flow path parts 12 and 13 are alternately formed. The first flow path part 11 is connected to an entrance 2 of the water-cooling type cooler 1, and the third flow path part 13 is connected to an exit 3 of the water-cooling type cooler 1.

In the related art water-cooling type cooler 1 as described above, cooling water is introduced through the entrance 2, pass through the first and second flow path parts 11 and 12, and then enters the third flow path part 13. In this case, because the third flow path 13 is divided into a plurality of flow paths by the cooling pins 15, the cooling water, which has entered the third flow path part 13, is distributed to the plurality of flow paths in passing through the third flow path part 13. In this process, the cooling water is brought into contact with the cooling pins 15, quickly cooling components that generated much heat like the power module. After the cooling water alternately passes through the second and third flow path parts 12 and 13 which are continued, and then discharged through the exit 3. This sequential processes are repeatedly performed.

However, the related art water-cooling type cooler 1 has the following problem. That is, because the flow path of cooling water is bent at the curved portion, namely, at the second flow path 12, the cooling water is concentrated to an outer side due to centrifugal force, resulting in an uneven distribution of cooling water. In addition, because a flow rate of an outer side is relatively faster, generating vortex to degrade the flow of cooling water. In order to overcome this problem, a plurality of cooling pin may be formed in the second flow path part 12, but in this case, a fabrication cost and weight of the water-cooling type cooler 1 increase to lead to an increase in the weight of an electric vehicle employing the inverter having the water-cooling type cooler 1, causing a problem in that the performance of the vehicle deteriorates.

SUMMARY OF THE INVENTION

Therefore, in order to address the above matters, the various features described herein have been conceived.

An aspect of the present invention provides a water-cooling type cooler capable of distributing cooling water evenly and preventing a generation of vortex by improving a cooling water flow path, thus enhancing a cooling efficiency and reducing the cost and weight.

According to an aspect of the present invention, there is provided a water-cooling type cooler in which a cooling water flow path is formed on at least one side and includes an entrance and exit to allow cooling water to flow, the cooling water flow path includes one or more bent faces formed between the entrance and exit, the bent faces are formed to be continued from a linear face, and the linear face includes one or more cooling pins for partitioning the cooling water flow path into a plurality of channels, wherein the cooling water flow path including the bent face includes a guide pin partitioning the cooling water flow path into the plurality of channels along the bent face.

The guide pin may be formed such that it integrally extends from the cooling pin, its upper flow end may be positioned before the bent face starts, and one guide pin may be formed to correspond to each bent face.

According to another aspect of the present invention, there is provided a water-cooling type cooler in which a cooling water flow path is formed on at least one side and includes an entrance and exit to allow cooling water to flow, wherein the cooling water flow path includes: a first flow path part linearly connected to the entrance; a second flow path part bent and connected to the first flow path part; and a third flow path part linearly connected to the second flow path part and partitioned into a plurality of channels with one or more cooling pins formed therein, wherein a guide pin is formed in the second flow path part in order to partition the second flow path part into a plurality of channels.

The guide pin may be formed at a position bisecting the width of the first flow path part in a widthwise direction, and an upper flow end of the guide pin may overlap with that of the cooling pins on plane.

The guide pin may be formed such that a portion of its upper flow end belongs to the first flow path part, and a portion of the end of the cooling pins belongs to the second flow path part.

The guide pin may be formed to integrally extend from the cooling pin, and the first flow path part may be formed such that its sectional area is not larger than that of the second flow path part or the third flow path part.

According to another aspect of the present invention, there is provided an inverter including: an inverter body including electric and electronic components that generate heat; and a water-cooling type cooler installed within the inverter body and being in contact with the electric and electronic components in order to cool heat generated from the electric and electronic components, wherein the water-cooling type cooler has the foregoing characteristics.

The foregoing and other objects, features, aspects and advantages of the present invention will become more apparent from the following detailed description of the present invention when taken in conjunction with the accompanying drawings.

DETAILED DESCRIPTION OF THE INVENTION

A water-cooling type cooler according to an exemplary embodiment of the present invention will now be described with reference to the accompanying drawings.

Figure 2:
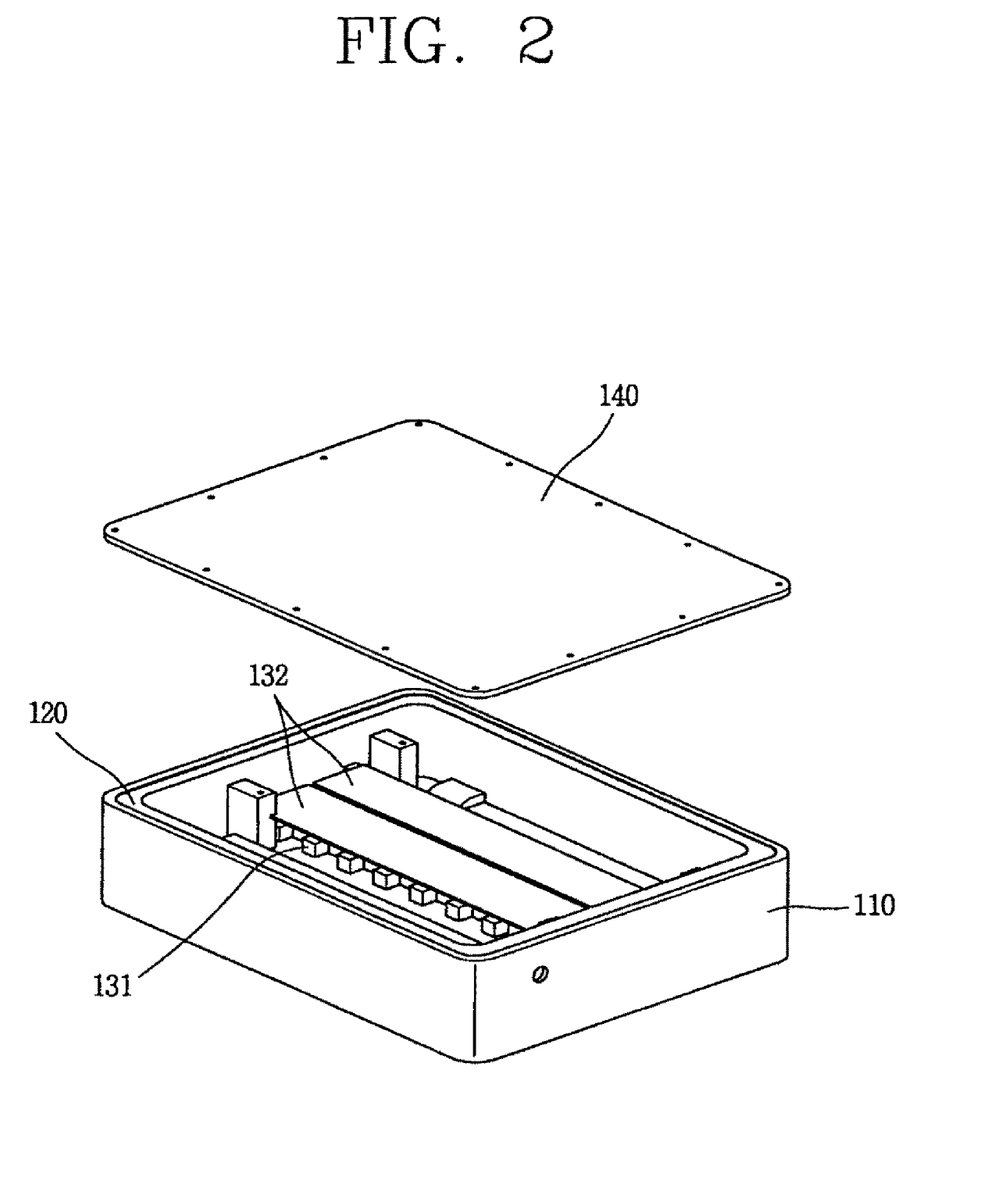
FIG. 2 is a perspective view showing the interior of an inverter employing a water-cooling type cooler according to an exemplary embodiment of the present invention.
Figure 3:
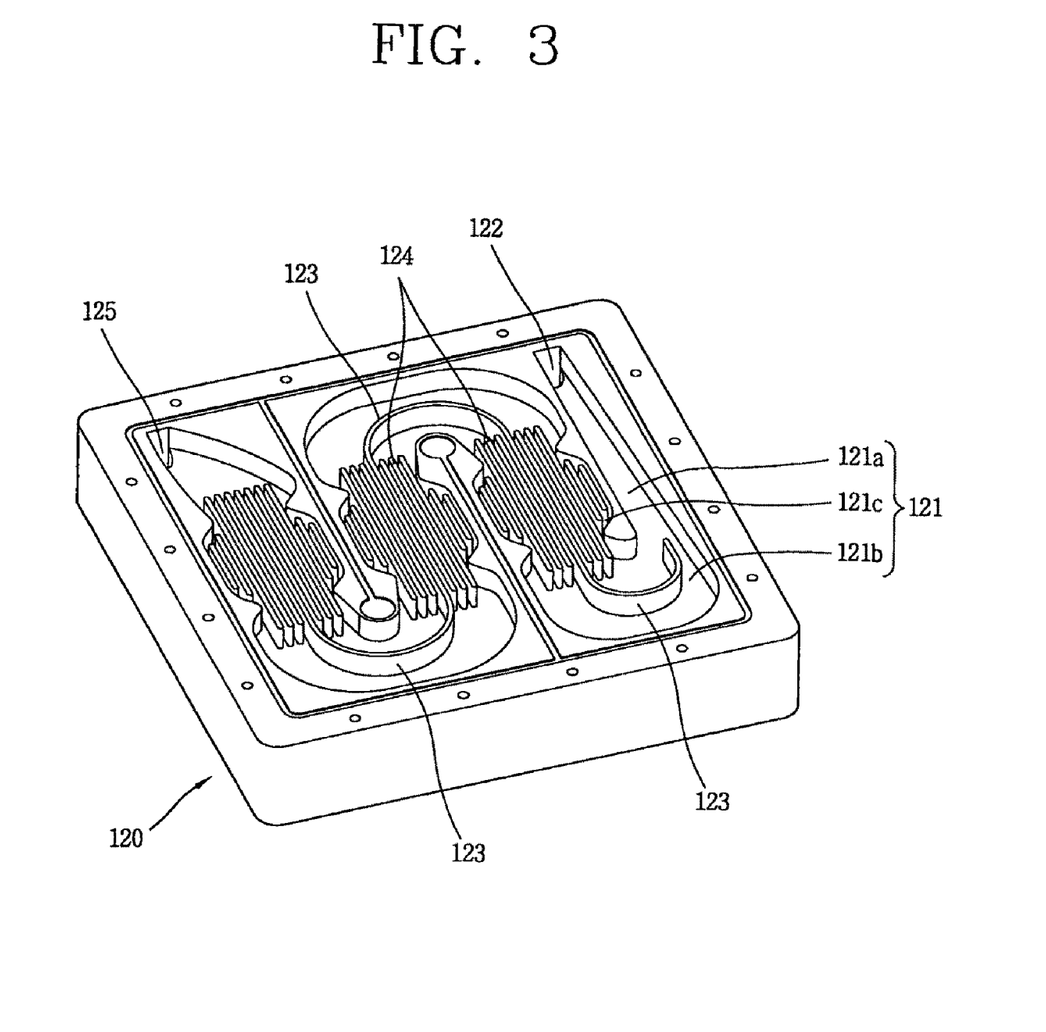
FIG. 3 is a perspective view of the water-cooling type cooler of the inverter in FIG. 2.
Figure 4:
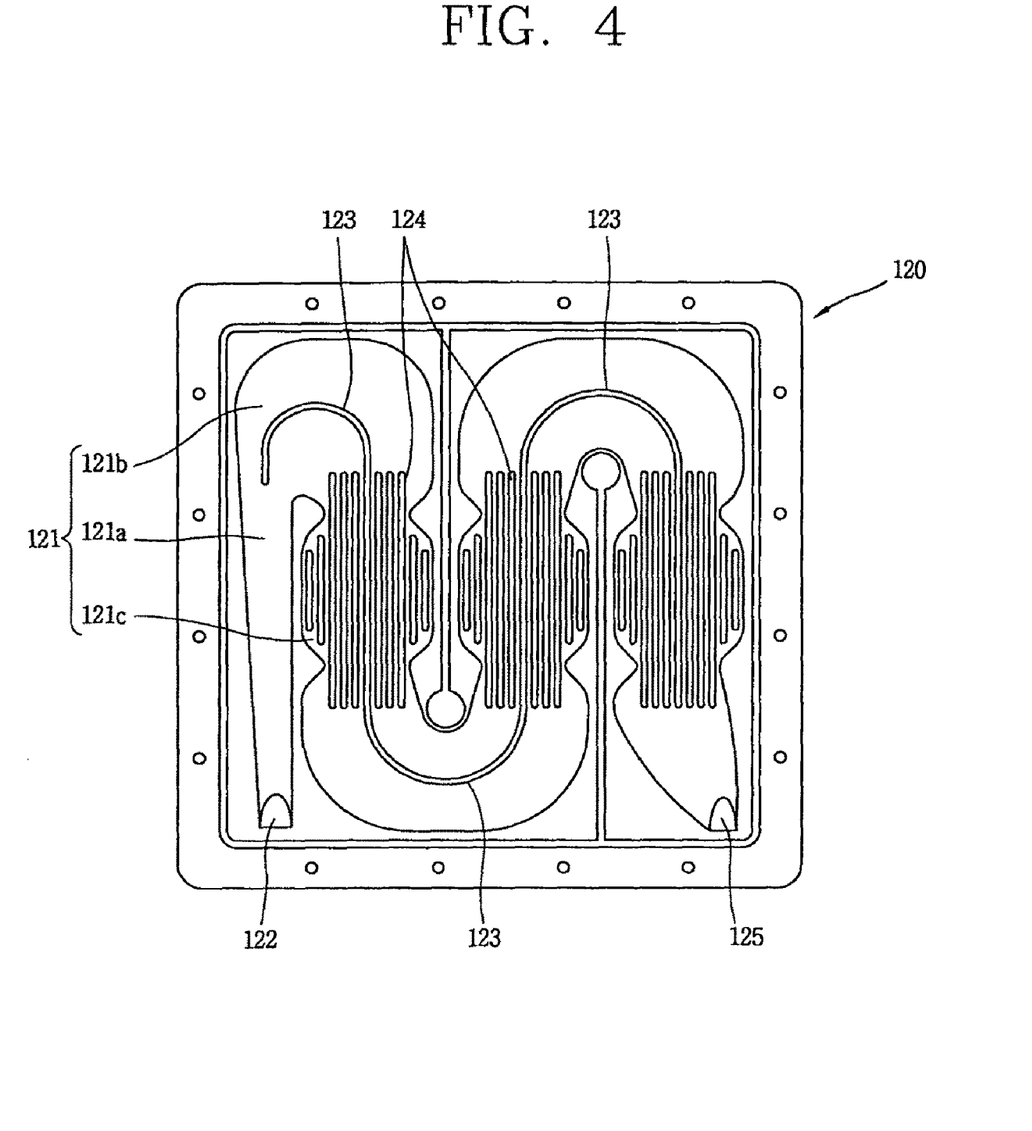
FIG. 4 is a plan view of the water-cooling type cooler in FIG. 3.
Figure 5:
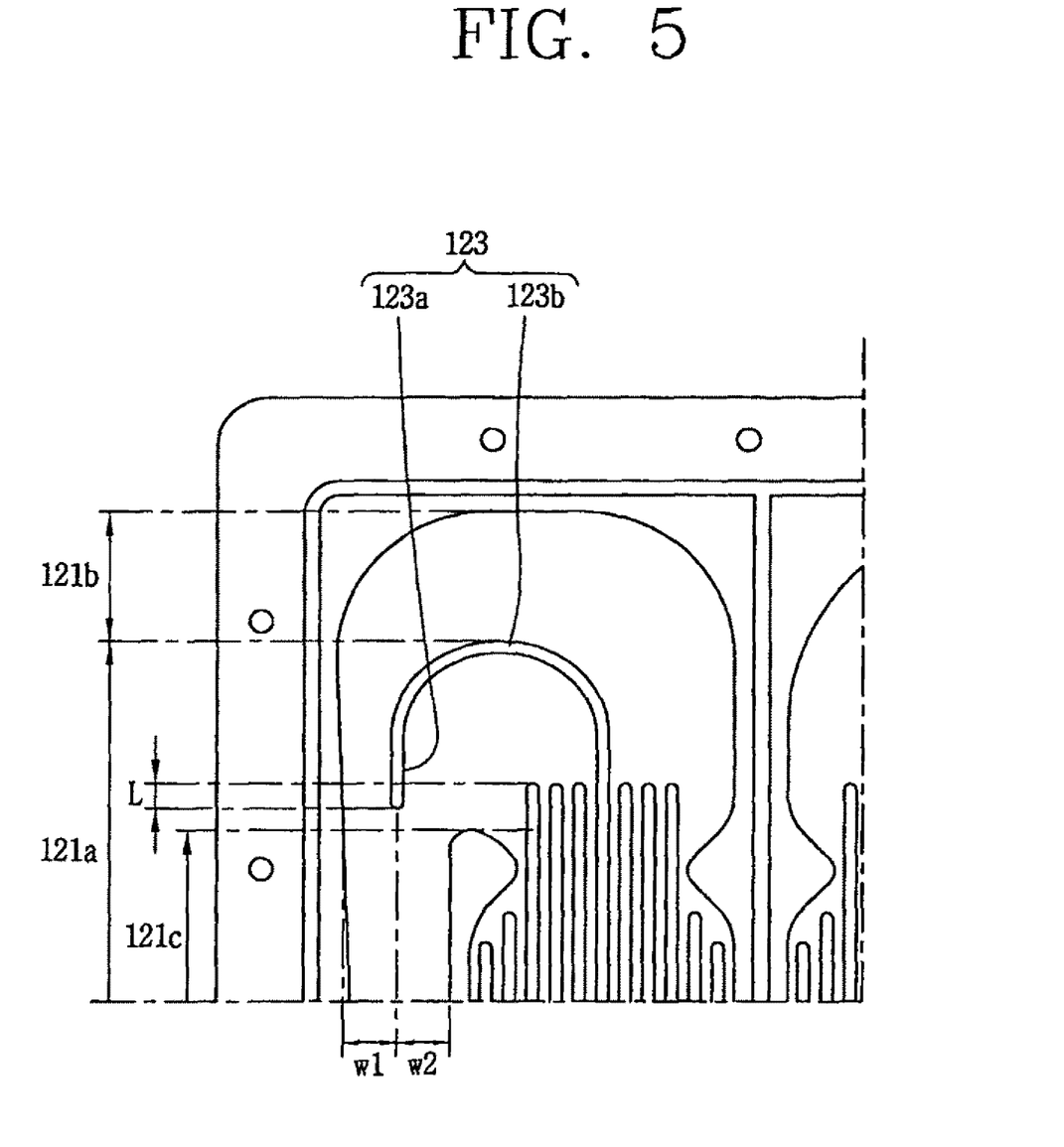
FIG. 5 is an enlarged plan view showing a major part of the water-cooling type cooler in FIG. 4.

FIG. 2 is a perspective view showing the interior of an inverter employing a water-cooling type cooler according to an exemplary embodiment of the present invention. FIG. 3 is a perspective view of the water-cooling type cooler of the inverter in FIG. 2. FIG. 4 is a plan view of the water-cooling type cooler in FIG. 3. FIG. 5 is an enlarged plan view showing a major part of the water-cooling type cooler in FIG. 4.

As shown in FIG. 2, an inverter including a water-cooling type cooler according to an exemplary embodiment of the present invention includes an inverter main body 110 with one side open, a water-cooling type cooler 120 installed within the inverter main body 110, a power module 131 and a board 132 installed within the water-cooling type cooler 120, and a cover 140 covering the open side of the inverter main body 110.

The water-cooling type cooler 120 may have a box-like shape or a plate shape with one side open. The water-cooling type cooler 120 may be made of a material having good thermal conductivity like aluminum. Because the water-cooling type cooler 120 needs to include a guide pin 123 or cooling pins 124, so, preferably, the water-cooling type cooler 120 is fabricated through a casting method by applying pressure to a molten metal, a precision casting method which is used to obtain a high-degree casting by forming a precise cast, unlike the general sand casting method. In particular, a dicasting method having many advantages of allowing for a high speed mass production, a precision in dimension, a smoothness of a surface, light-weight casting, a reduction in cutting process, and the like.

The water-cooling type cooler 120 includes a cooling water flow path 121 formed on an outer surface, namely, a surface in contact with the inverter main body 110, in order to cool heat generated from the power module 131 and the like.

The cooling water flow path 121 may be formed generally in zigzags in order to expand a contact area between the water-cooling type cooler 120 and cooling water and lengthen a contact time period. However, the cooling water flow path 121 may have various other shapes depending on the position of the power module 131 installed within the inverter main body 110 and depending on the number of power switching elements constituting the power module 131 or the positions of the power switching elements.

As shown in FIGS. 3 and 4, the cooling water flow path 121 includes a first path part 121*a* linearly connected to an entrance 122, a second flow path part 121*b* bent from the first flow path part 121 and divided into a plurality of channels by a guide pin 121 (to be described), and a third flow path part 121c linearly connected to the second flow path part 121b, including one or more cooling pins 124 formed therein so as to be divided into a plurality of channels, and connected to an exit 125.

The first flow path part 121a may have a sectional area smaller than that of the second flow path part 121b or the third flow path part 121c, and the sectional area of the first flow path part 121a may have such a shape as it gradually expands toward the second flow path part 121b from the entrance 122.

The second flow path part 121b is bent from the first flow path part 121a substantially at a right angle direction, and its corner portion is formed to be rounded. The sectional area of the second flow path part 121b may be larger than that of the first flow path part 121a or may be smaller or larger than that of the third flow path part 121c. The second flow path part 121b includes the guide pin 123 having a similar shape to that of the second flow path part 121b.

The guide pin 123 extends from a cooling pin substantially positioned in the middle of the cooling pins 124, and as shown in FIG. 5, preferably, an upper flow end of the guide pin 123, namely, the end closest to the entrance 122, includes a linear portion 123a within the range of the first flow path part 121a in order to evenly distribute cooling water in the first flow path part 121a. A plurality of guide pins 123 may be formed; however, in this case, the space between the bent guide pins 123 would be too narrow to cause a defect in fabricating the water-cooling type cooler 120. Thus, preferably, one guide pin may be formed in the second flow path part 121b, and it may be positioned at the center of the section so as to bisect the second flow path part 121b (w1=w2).

As shown in FIG. 5, preferably, the end of the guide pin 123 based on the direction in which cooling water flows extends up to a position (L) so as to overlap with the cooling pins 124 on plane to allow cooling water to directly flow from the first flow path part 121a to the third flow path part 121c, or to flow while being evenly distributed to the second flow path part 121b, rather than being concentrated to an outer channel even in the second flow path part 121b.

The third flow path part 121c is formed to be substantially parallel too the first flow path part 121a. An inlet and outlet of the third flow path part 121c are narrow, and the space between the inlet and the outlet is relatively large. The cooling pins 124 are formed in the third flow path part 121c in order to divide the third flow path part 121c.

The cooling pins 124 are formed at different intervals, but preferably, they are formed at the same intervals in order to allow cooling water to be evenly distributed. The cooling pins 124 may be formed such that the pitch of the pins at a region from which much heat is generated is narrower and the pitch of the pins at a region from which less heat is generated is wider.

The water-cooling type cooler according to an exemplary embodiment of the present invention has the following operational effect.

Namely, in the inverter, a control board (no reference numeral given) receives a signal from an external source of the inverter and transfers a control command to a power board (no reference numeral given). When the signal is transferred from the control board to the power board, the signal transferred to the power board is transferred to a driving board (no reference numeral given) to implement a switching operation of the power module 131, to thus drive the inverter. Then, heat is generated from the power module 131, which is heat-exchanged with cooling water flowing in the water-cooling type cooler 120 so as to be cooled.

Figure 6:
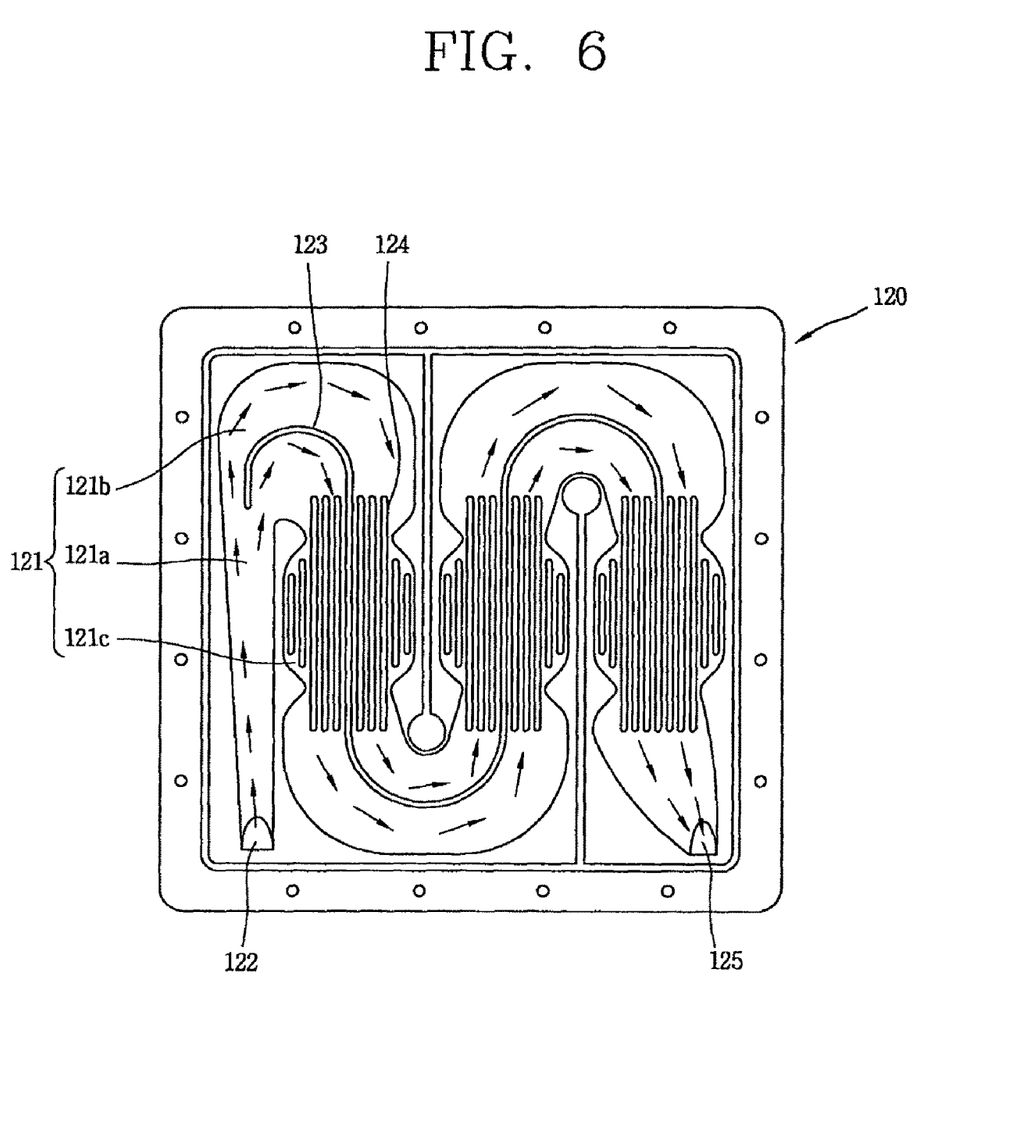
FIG. 6 is a plan view showing a flow state of cooling water in the water-cooling type cooler according to an exemplary embodiment of the present invention.

Here, because the cooling water flow path 121 provided in the water-cooling type cooler 120 is formed in zigzags, cooling water is likely to be concentrated to an outer side of the cooling water flow path 121 due to a centrifugal force at the bent or curved region or vertex is likely to be generated due to a flow rate difference. In this case, however, as shown in FIG. 6, because the guide pin 123 is formed at the bent or curved portion to bisect the cooling water flow path 121, cooling water can be evenly distributed in the cooling water flow path 121, rather than being concentrated to an outer side or causing a vertex. Thus, because the cooling water can be evenly distributed without having to form a plurality of cooling pins 124 in the cooling water flow path 121 of the water-cooling type cooler 120, the water-cooling type cooler 120 can be lighter and low-priced and have a high cooling efficiency.

As shown, in the water-cooling type cooler 120 according to an exemplary embodiment of the present invention, because the guide pin 123 is formed in the second flow path part 121b, cooling water that passes through the first flow path part 121a can be evenly distributed by the guide pin 123 in the second flow path part 121b and then evenly flow to the third flow path part 121c. Accordingly, a flow rate at the inner side and that at the outer side is not much different in the second flow path part 121b, so cooling water can be prevented from being lopsided as well as preventing generation of vortex. Thus, cooling water can be evenly distributed.

The water-cooling type cooler according to an exemplary embodiment of the present invention can be applied to an inverter used for electric vehicles such as the foregoing hybrid vehicle, a fuel cell vehicle, a golf vehicle, a forklift, or an inverter used for a solar energy generation system or a wind power plant system.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or is equivalents of such metes and bounds are therefore intended to be embraced by the appended claims.

What is claimed is:

1. A water-cooling-type cooler comprising:
a cooling water flow path on at least one side of the water-cooling-type cooler, the cooling water flow path including an entrance and an exit for allowing cooling water to flow and one or more bent portions between the entrance and the exit, the one or more bent portions connected to a plurality of linear portions, each of the plurality of linear portions including a plurality of cooling pins for partitioning the plurality of linear portions of the cooling water flow path into a first plurality of channels, the cooling water flow path further including a guide pin for bisecting a width of the one or more bent portions of cooling water flow path into a second plurality of channels,
wherein the guide pin integrally extends from at least one of the plurality of cooling pins,
wherein an end portion of the guide pin intersects a plane that is perpendicular to an end portion of the plurality of cooling pins,
wherein the guide pin is passing through at least one of the one or more bent portions, and wherein a cross-sectional area at a center of each of the plurality of cooling pins is greater than a cross-sectional area at either end portion of the corresponding cooling pin.

2. The water-cooling-type cooler of claim 1, wherein the end portion of the guide pin extends from the one or more bent portions into at least one of the plurality of linear portions.

3. A water-cooling-type cooler comprising:
a cooling water flow path on at least one side, the cooling water flow path including an entrance and an exit to allow for allowing cooling water to flow,
wherein the cooling water flow path comprises:
  a first flow path portion that is linearly connected to the entrance;
  a second flow path portion that is bent and connected to the first flow path portion; and
  a third flow path portion that is linearly connected to the second flow path portion and partitioned into a first plurality of channels via a plurality of cooling pins formed in the third flow path portion,
wherein a guide pin is termed in the second flow path portion in order to bisect a width of the second flow path portion into a second plurality of channels,
wherein the guide pin integrally extends from at least one of the plurality of cooling pins,
wherein an end portion of the imide pin intersects a plane that is perpendicular to an end portion of the plurality of cooling pins,
wherein the guide pin is passing through at least one of the one or more bent portions, and
wherein a cross-sectional area at a center of each of the plurality of cooling pins is greater than a cross-sectional area at either end portion of the corresponding cooling pin.

4. The water-cooling-type cooler of claim 3, wherein the end portion of the guide pin is contained in the first flow path portion.

5. The water-cooling-type cooler of claim 3, wherein the end portion of each of the plurality of cooling pins is contained in the second flow path portion.

6. The water-cooling-type cooler of claim 3, wherein a cross-sectional area of the first flow path portion is not larger than a cross-sectional area of the second flow path portion or the third flow path portion.

7. An inverter comprising:
an inverter body including electronic components that generate heat; and
a water-cooling-type cooler included in the inverter body and contacting the electronic components in order to cool the generated heat,
wherein the water-cooling type cooler comprises a cooling water flow path including a plurality of linear portions comprising a plurality of cooling pins that partition each of the plurality of linear portions of the cooling water flow path into a first plurality of channels and one or more bent portions comprising a guide pin that bisects a width of the one or more bent portions of the cooling water flow path into a second plurality of channels,
wherein the guide pin integrally extends from at least one of the plurality of cooling pins,
wherein an end portion of the guide pin intersects a plane that is perpendicular to an end portion of the plurality of cooling pins,
wherein the guide pin is passing through at least one of the one or more bent portions, and
wherein a cross-sectional area at a center of each of the plurality of cooling pins is greater than a cross-sectional area at either end portion of the corresponding cooling pin.

8. The inverter of claim 7, wherein the end portion of the guide pin extends from the one or more bent portions into at least one of the plurality of linear portions.

9. An inverter comprising:
an inverter body including electronic components that generate heat; and
a water-cooling-type cooler included in the inverter body and contacting the electronic components in order to cool the generated heat,
wherein the water-cooling-type cooler includes a cooling water flow path formed on at least one side of the water-cooling-type cooler and comprises an entrance and an exit for allowing cooling water to flow, wherein the cooling water flow path comprises:
  a first flow path portion that is linearly connected to the entrance;
  a second flow path portion that is bent and connected to the first flow path portion; and
  a third flow path portion that is linearly connected to the second flow path portion and partitioned into a first plurality of channels via a plurality of cooling pins formed in the third flow path portion,
wherein a guide pin is formed in the second flow path portion in order to bisect a width of the second flow path portion into a second plurality of channels,
wherein the guide pin integrally extends from at least one of the plurality of cooling pins,
wherein an end portion of the guide pin intersects a plane that is perpendicular to an end portion of the plurality of cooling pins,
wherein the guide pin is passing through at least one of the one or more bent portions, and
wherein a cross-sectional area at a center of each of the plurality of cooling pins is greater than a cross-sectional area at either end portion of the corresponding cooling pin.

10. The inverter of claim 9, wherein an end portion of the guide pin is contained in the first flow path portion and an end portion of the plurality of cooling pins is contained in the second flow path portion.

11. The inverter of claim 9, wherein a cross-sectional area of the first flow path portion is not larger than a cross-sectional area of the second flow path portion or the third flow path portion.

* * * * *